United States Patent
Williamson

Patent Number: 5,986,446
Date of Patent: Nov. 16, 1999

[54] MULTI-METER AND PROBE ASSEMBLY AND METHOD OF USE

[75] Inventor: C. Blake Williamson, 201 Gilson Ave., Weirton, W. Va. 26062

[73] Assignee: C. Blake Williamson, Weirton, W. Va.

[21] Appl. No.: 08/795,812

[22] Filed: Feb. 5, 1997

[51] Int. Cl.⁶ .............. G01R 1/04; G01R 1/067; G01R 31/02

[52] U.S. Cl. .............. 324/157; 324/72.5; 324/149; 73/866.5

[58] Field of Search .............. 324/72.5, 133, 324/149, 156, 157, 757, 758; 73/431, 866.5; 439/37, 169, 219, 482, 909; 235/462.44, 462.45

[56] References Cited

U.S. PATENT DOCUMENTS

| | | | |
|---|---|---|---|
| 2,819,448 | 1/1958 | Neeper | 324/156 X |
| 3,109,141 | 10/1963 | Blackwell | 324/149 X |
| 3,609,538 | 9/1971 | Schag | 324/66 |
| 3,662,078 | 5/1972 | Holiday | 439/37 X |
| 4,068,164 | 1/1978 | Schwartz et al. | |
| 4,337,496 | 6/1982 | Laird | |
| 4,887,249 | 12/1989 | Thinesen | |
| 4,983,954 | 1/1991 | Huston | |
| 5,012,817 | 5/1991 | Zeilinski et al. | |
| 5,029,296 | 7/1991 | Shang-Wen | 324/156 |
| 5,152,293 | 10/1992 | Vonesh et al. | |
| 5,242,440 | 9/1993 | Shippert | |
| 5,337,744 | 8/1994 | Branigan | |
| 5,503,156 | 4/1996 | Millar | |
| 5,610,387 | 3/1997 | Bard et al. | 235/462.44 |
| 5,671,747 | 9/1997 | Connor | |
| 5,793,032 | 8/1998 | Bard et al. | |

FOREIGN PATENT DOCUMENTS

| 1387091 | 3/1975 | United Kingdom . |
|---|---|---|

*Primary Examiner*—Gerard Strecker
*Attorney, Agent, or Firm*—Renner, Otto, Boisselle & Sklar, P.L.L.

[57] ABSTRACT

A meter is mounted on the wrist of the user with a suitable strap while the active or positive probe from the meter extends through a probe holder on the finger of the user. The probe lead is fairly short extending from the meter, through the probe holder to project beyond the index or pointing finger. Two forms of holding the probe to the finger are illustrated. The other probe to ground or neutral is longer and provided with a contact clip. The invention frees both hands of the user or at least all of the fingers except the one used to point the probe. With the invention the meter is more effectively and economically used.

20 Claims, 1 Drawing Sheet

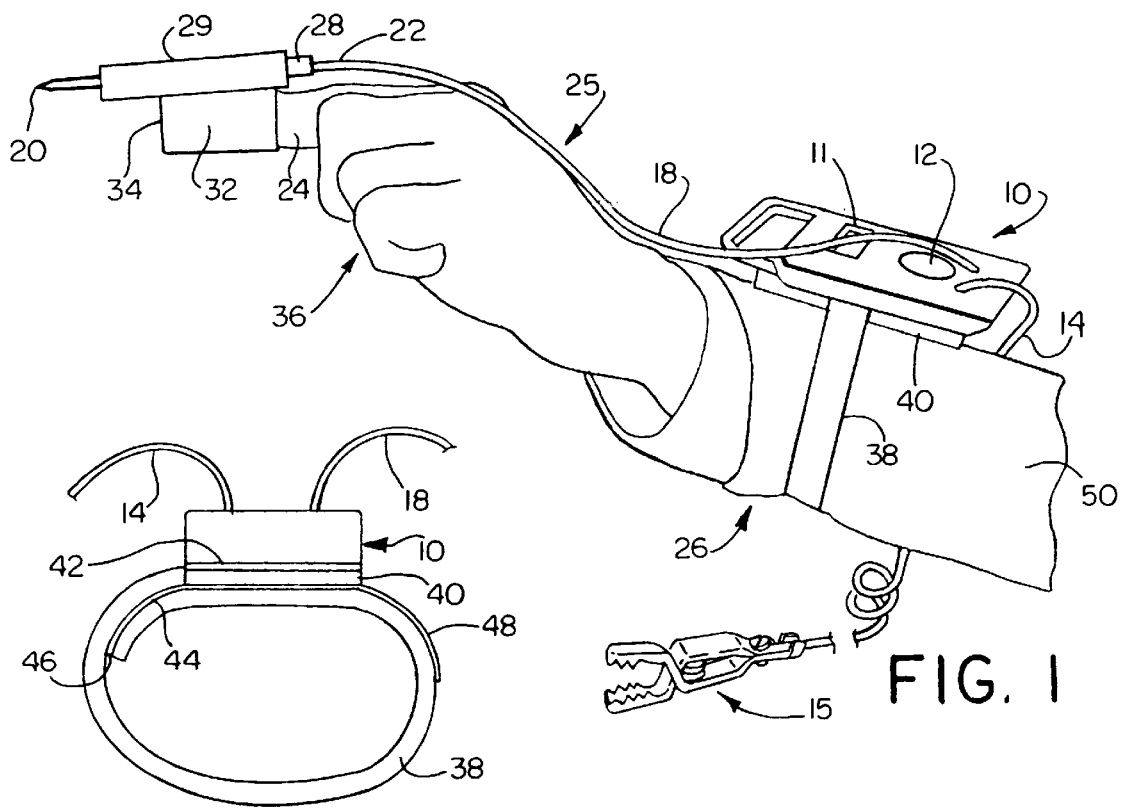
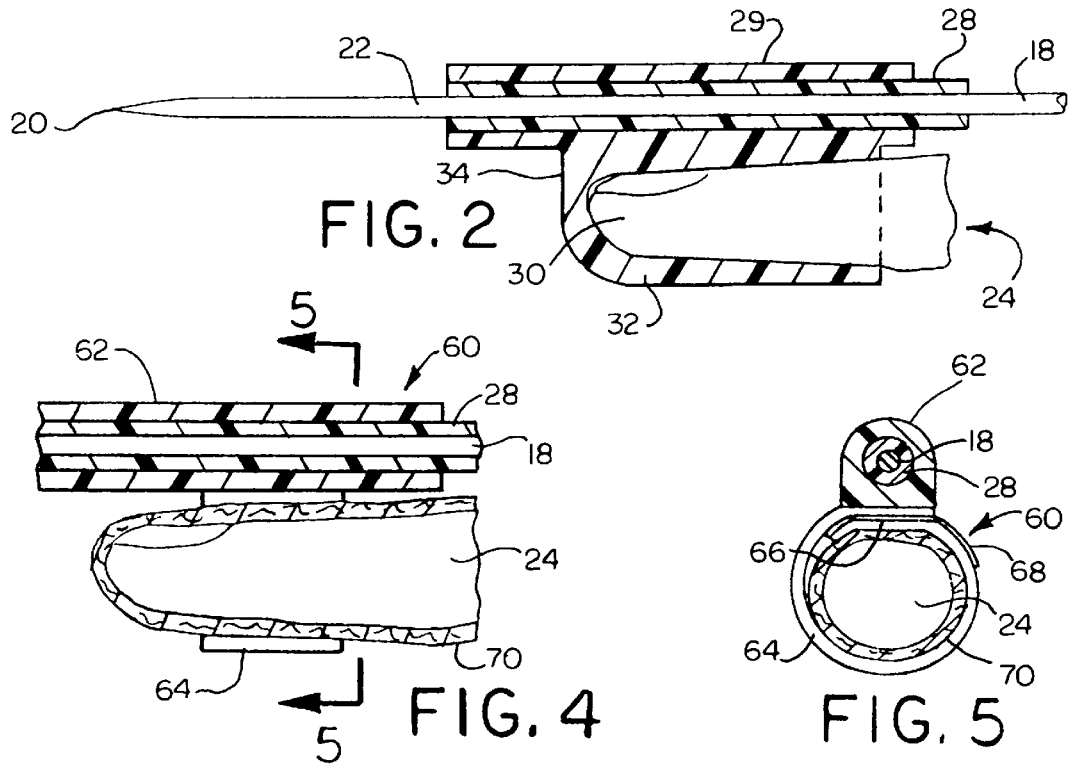

MULTI-METER AND PROBE ASSEMBLY AND METHOD OF USE

DISCLOSURE

This invention relates generally as indicated to a multi-meter and method of use, and more particularly to certain accessories for multi-meters and probe assembly their use.

BACKGROUND OF THE INVENTION

Workers in electrical installation and service fields have long used multi-meters for testing, measuring, or monitoring electrical current and potentials. When first introduced it consisted of a low current DC meter mounted in a rugged case with a complex switching arrangement using precision wire wound resisters, or shunts across, or in series. Such meters are now even more versatile. With a rectifier meters are both AC and DC with various ranges. By switching a dry cell battery in series with proper values it will check resistance values or continuity by using a reverse scale on the meter face. A multi-meter now is a most basic and essential instrument and allows the user to read, for example, AC and DC voltages and current, resistance, capacity, inductance, dBm, and frequency, all with two color coded test leads, and to test or check everything from small electronic components such as diodes, transistors or printed circuits, to larger apparatus such as panels, controllers, moving machinery panels, or large electrical structures. Few of the latter types of structures are tested under ideal conditions and can present many hazards to the user of a multi-meter.

For example, using a multi-meter standing on a ladder is not easy. The user may often wish for more than two hands. One hand may be required simply to hang on or adjust a safety harness. The physical hazards can be much worse such as hundreds of feet in the air on an antenna or transmission tower or mast. Many such structures are designed to sway or move. On a tower or mast of a ship at sea the swaying or movement can be extreme. Also, control panels may be dark, complicated and with close quarters, and full of high voltage lines, relays and other moving parts. Often times a multi-meter user needs a helper if for no other reason than to hold a flashlight or take notes.

Such meters may be used in wall cavities or in an engine compartment, under the dash, or even under a car. If the electrical panel is on a moving train or vehicle the situation becomes even more difficult.

One of the most important items used with any multi-meter is the test leads. Today test leads come with a variety of tips and accessories. Many are made with different plastic compounds and come in various lengths. The test lead in measuring voltage, resistance and current flow is usually not considered important. One common problem is the length of wire on most test leads. The wire usually dangles, wraps around other objects, or just gets in the way, and most users have learned to put up with lead problems.

Any person who has used a meter over any length of time has encountered the problems noted above by dropping or burning out meters, by putting the probe inadvertently into hot or moving equipment, or by tangling the probe lead. The cost of the problem in time, meters and equipment is extraordinary.

It would accordingly be advantageous if a multi-meter user could take full advantage of the instrument without the problems noted above.

SUMMARY OF THE INVENTION

The multi-meter of the present invention is a standard relatively light weight unit. The neutral or negative probe is about 24 to 30 inches in length and is provided at its outer end with an alligator or clothespin test clip enabling it to be attached to a variety of structures with good electrical contact. The multi-meter is designed to be mounted on the wrist of the user almost like a large wrist watch. For this purpose the back of the multi-meter is mounted on a strap adapted to encircle the wrist. For convenience, a VELCRO® strap fastener is preferred. VELCRO is a registered trademark of VELCRO Industries BV of Amsterdam, Holland. The back of the multi-meter may be provided with a VELCRO surface enabling the meter readily to be mounted on and removed from the strap. In this manner the strap is adjustable to fit the user, and the meter can be removed and repositioned easily. When supported on the wrist, the meter is readily visible and both hands of the user are free.

The other probe is considerably shorter with a pointed tip and extends from the meter through a friction sleeve adapted to be mounted on and extend parallel to a finger of the hand of the wrist on which the meter is mounted. The finger is normally the index or pointing finger. The pointed end of the probe projects beyond the finger and may be manipulated and pointed just like a finger while leaving all other fingers and the other hand free. In this manner the hand of the finger on which the probe is mounted may hold something else such as a flashlight or pin light.

The sleeve extends through a probe holder. The probe extends well beyond the finger. The holder may be mounted on a closed end finger cuff or cot which may simply slip over the end of a bare finger or a gloved finger. The sleeve and cuff are formed of electrical insulation material. Alternatively, the sleeve may be attached to a gloved finger by a somewhat smaller version of the VELCRO strap holding the meter to the wrist. The entire system includes the meter adapted to be mounted on the adjustable wrist strap, the two leads with the longer neutral lead having the clip, the shorter lead, and the pointed fixed finger probe attached to the finger of the hand of the wrist of the user. In this manner the meter is much more effectively and economically utilized.

To the accomplishment of the foregoing and related ends, the invention then comprises the features hereinafter fully described and particularly pointed out in the claims, the following description and the annexed drawings setting forth in detail certain illustrative embodiments of the invention, these being indicative, however, of but a few of the various ways in which the principles of the invention may be employed.

BRIEF DESCRIPTION OF THE DRAWINGS

FIG. 1 is a broken elevation of the meter attached to a user's wrist and the pointed probe in position;

FIG. 2 is an enlarged longitudinal section through the finger, cot, probe, and holder;

FIG. 3 is a transverse section through the wrist showing the meter and strap;

FIG. 4 is a view like FIG. 2 showing a smaller strap holding the probe to a gloved finger; and FIG. 5 is a section taken substantially on the line 5—5 of FIG. 4.

DETAILED DESCRIPTION OF THE PREFERRED EMBODIMENTS

Referring initially to FIG. 1 there is illustrated a multi-meter shown generally at 10 which may include a digital or analog read out 11 and a selector switch 12. Many different types of multi-meters may be employed with the present invention.

The negative, neutral or ground lead is shown generally at 14 and is approximately 24–30 inches in length. The end of the lead is provided with a test clip indicated at 15. An alligator or other type of clothespin clip may equally well be employed.

The positive or active lead shown at 18 is much shorter being on the order of approximately 10inches in length and extends from the meter to a sharp pointed tip indicated at 20. The lead 18, or at least the tip of the lead which includes the probe shank 22, is preferably made of a semi-rigid conductive plastic. The length of the lead 18 from the meter 10 to the tip 20 is selected so that the tip will project substantially beyond the index finger 24 of the left hand as illustrated at 25 of the user when the multi-meter 10 is mounted on the wrist of such left hand as illustrated at 26.

The shank of the probe extends through a friction sleeve 28 seen more clearly in FIG. 2 which is mounted in a probe holder 29. Both the sleeve and holder are axially elongated and extend generally parallel to and beyond the tip 30 of the finger 24. The holder 29 is integrally formed with a generally elastic finger cot 32 which slips over and grips the end of the finger 24 as shown. The probe shank 22 projects substantially beyond the holder and the tip of the finger to the point 20. The finger cot or cuff is closed at the front end as indicated at 34 to protect the front end of the tip of the finger. When the probe is held in this manner, the other fingers shown at 36 of the left hand of the user are free to hold anything else.

The multi-meter 10 is mounted on the wrist at 26 by means of a strap indicated generally at 38 and illustrated more clearly in FIG. 3. One end of the strap terminates in a transversely elongated pad seen at 40 which is preferably provided with a VELCRO fastening surface on both the inner and outer surfaces. The outer VELCRO fastening surface seen at 42 is used to secure the back of the multi-meter to the pad. The multi-meter may simply be removed from the strap by tugging it off of the pad. The inner side of the pad is also provided with a VELCRO surface seen at 44 which may extend to the point 46 on the interior of the strap 38. The opposite side of the strap at the free end is also provided with a VELCRO surface 48. The VELCRO surface 44 then mates with the VELCRO surface 48 to secure the strap as shown in FIG. 3 when looped around the wrist either directly or on the outside of the sleeve of a shirt or jacket as seen at 50.

It will be appreciated that there are many other ways to form a strap securing the multi-meter to the wrist of the user, both using VELCRO fastening systems or other systems such as a conventional watch band strap. VELCRO is preferred because of its ready adjustability. With the system illustrated, both the wrist strap or the multi-meter may be attached collectively or individually. For example, the meter may readily be removed or replaced leaving the band in place on the wrist or sleeve of the user. When in position as illustrated in FIG. 1, the read out or dial indicated at 11 is readily in line with the hand and eye coordination needed to touch the tip of the probe 20 to a test point. In other words, the user does not have to put the probe in place and then turn his head to look downwardly or to the side.

Referring now to FIGS. 4 and 5 there is illustrated an alternative form of probe holder shown generally at 60. The holder housing 62 has a slightly D-shape transverse configuration and the flat side of the D is secured to a strap 64. The interior of the strap at the housing 62 is provided with a VELCRO surface shown generally at 66 which mates with a VELCRO surface 68 on the exterior of the other end of the strap. In this manner the strap and probe holder may easily be positioned on the finger 24 even though wearing a glove 70. In this manner the tip of the pointing finger, usually the index finger, is protected. Although the probe illustrated is specifically designed to be used with the pointing finger attachment or holder, it can be removed from or replaced in the holder.

It can now be seen that there is provided a multi-meter and method of use which avoids loosing the multi-meter, makes the multi-meter easier to read, and the measurements easier to take. The present invention makes the use of the multi-meter much more effective and economic.

To the accomplishment of the foregoing and related ends, the invention then comprises the features particularly pointed out in the claims, these being indicative, however, of but a few of the various ways in which the principles of the invention may be employed.

I claim:

1. In combination, a multi-meter, first means operative to support and attach said multi-meter to the wrist of the user, a pair of leads for the meter, a probe for the meter connected to one of said leads, and second means operative to support and attach said probe to a pointing finger of the hand of the wrist of the user so that the probe points in general alignment with and beyond the tip of the pointing finger.

2. The combination set forth in claim 1 wherein said first means is a strap, and third means to attach and remove said multi-meter from the strap so that the meter can readily be read while manipulating the probe.

3. The combination set forth in claim 1 wherein said first means includes a VELCRO fastening system.

4. The combination set forth in claim 2 wherein said first and third means includes a VELCRO fastening system.

5. The combination set forth in claim 1 wherein said second means includes a finger cot.

6. The combination set forth in claim 5 wherein said finger cot is closed over the tip of the finger protecting the tip of the pointing finger.

7. The combination set forth in claim 5 wherein said finger cot is elastic.

8. The combination set forth in claim 1 wherein said second means includes a VELCRO strap fastening system adapted to encircle a gloved pointing finger.

9. The combination set forth in claim 1 wherein said second means to attach a probe to a pointing finger includes a friction sleeve for the probe and a probe housing for the sleeve.

10. The combination set forth in claim 1 wherein the lead connecting the probe to said multi-meter is substantially shorter than the other lead, and a clip connected to the other lead.

11. In combination, an electrical multi-meter, two leads for said multi-meter, one of which comprises a probe, a holder for said probe, and a finger cuff attached to said holder whereby the user may support the probe with a single finger when said finger cuff is positioned on said single finger and point the probe to make electrical contact by manipulation of said single finger.

12. The combination set forth in claim 11 including means to attach the multi-meter to the wrist of the hand of said finger on which the cuff supporting the probe is positioned.

13. A method of using a meter comprising the steps of attaching the meter to the wrist of a user, connecting one lead of the meter to a pointed probe, extending the probe through a holder, and mounting the holder on a finger of the hand of the wrist so the probe can be manipulated and directed by the finger.

14. A method as set forth in claim 13 including the step of positioning the tip of the probe beyond the tip of the finger.

15. A method as set forth in claim 14 including the step of mounting the holder on a finger cot protecting the tip of the finger.

16. A method as set forth in claim 14 including the step of using a strap to secure the holder to a gloved finger.

17. A method as set forth in claim 13 including the step of mounting the meter on an adjustable wrist strap for attachment to and detachment from the strap.

18. A method as set forth in claim 13 including the step of providing the meter with a second longer lead.

19. A method as set forth in claim 18 including the step of providing a spring clip on the second lead.

20. A method of taking electrical meter readings comprising the steps of mounting a probe for the meter and connected to the meter on the user's finger to extend parallel to and substantially beyond an extended finger, manipulating the probe with the finger, mounting the meter on the wrist of the hand of the finger, and reading the meter as the probe is manipulated with the finger.

* * * * *